(12) United States Patent
Bojan et al.

(10) Patent No.: US 7,864,529 B2
(45) Date of Patent: Jan. 4, 2011

(54) ELECTRONIC UNIT WITH SEALED COOLANT PASSAGE

(75) Inventors: Radu Vasile Bojan, Leicestershire (GB); Arnoud Smit, Regensburg (DE); Remus Sovagau, Timisoara (RO)

(73) Assignee: Siemens VDO Automotive AG, Munich (DE)

( * ) Notice: Subject to any disclaimer, the term of this patent is extended or adjusted under 35 U.S.C. 154(b) by 492 days.

(21) Appl. No.: 11/836,817

(22) Filed: Aug. 10, 2007

(65) Prior Publication Data

US 2008/0285230 A1 Nov. 20, 2008

(30) Foreign Application Priority Data

Aug. 10, 2006 (EP) .................................. 06464001

(51) Int. Cl.
*H05K 7/20* (2006.01)
*F28F 7/00* (2006.01)

(52) U.S. Cl. ....................... 361/699; 165/80.4; 361/698
(58) Field of Classification Search ................... 361/699
See application file for complete search history.

(56) References Cited

U.S. PATENT DOCUMENTS

| | | | | |
|---|---|---|---|---|
| 4,176,447 A | * | 12/1979 | Brennan | 29/623.5 |
| 4,912,600 A | * | 3/1990 | Jaeger et al. | 361/700 |
| 5,323,292 A | * | 6/1994 | Brzezinski | 361/689 |
| 5,349,498 A | * | 9/1994 | Tanzer et al. | 361/689 |
| 6,175,501 B1 | * | 1/2001 | Bortolini et al. | 361/720 |
| 6,414,867 B2 | * | 7/2002 | Suzuki et al. | 363/141 |
| 6,992,887 B2 | * | 1/2006 | Jairazbhoy et al. | 361/689 |
| 7,173,823 B1 | * | 2/2007 | Rinehart et al. | 361/699 |
| 7,177,153 B2 | * | 2/2007 | Radosevich et al. | 361/699 |
| 7,518,233 B1 | * | 4/2009 | Takahashi et al. | 257/704 |
| 2003/0053294 A1 | | 3/2003 | Yamada et al. | |
| 2005/0083655 A1 | * | 4/2005 | Jairazbhoy et al. | 361/699 |

FOREIGN PATENT DOCUMENTS

| | | |
|---|---|---|
| DE | 20 2004 008 004 U1 | 8/2004 |
| JP | 11163572 | 6/1999 |
| JP | 2004134542 | 4/2004 |

* cited by examiner

*Primary Examiner*—Gregory D Thompson
(74) *Attorney, Agent, or Firm*—Laurence A. Greenberg; Werner H. Stemer; Ralph E. Locher (57) ABSTRACT

To improve coolant sealing or reduce the risks in the event of leakage for an electronic unit, e.g. an engine control unit, containing electric and/or electronic components which are disposed on an upper side of a thermally conductive electronic base plate and thermally coupled to the base plate, the base plate in turn being thermally coupled to a coolant passage, there is provided a particular configuration and arrangement of the components delimiting a coolant passage. Advantageously, the underside of the base plate can come into direct contact with a coolant ("direct cooling"). By making a ridge running in an annularly closed manner and being formed in one-piece with the base plate, coolant escaping from the coolant passage is prevented from passing directly to the underside of the base plate. Accordingly, the coolant passage may be sealed by a "double sealing arrangement" on the underside of the base plate.

10 Claims, 5 Drawing Sheets

ELECTRONIC UNIT WITH SEALED COOLANT PASSAGE

CROSS-REFERENCE TO RELATED APPLICATION

This application claims the priority, under 35 U.S.C. §119, of European application EP 06 464 001, filed Aug. 10, 2006; the prior application is herewith incorporated by reference in its entirety.

BACKGROUND OF THE INVENTION

Field of the Invention

The present invention relates to an electronic unit, in particular a control unit for a motor vehicle, containing electric and/or electronic components that are disposed on the upper side of a thermally conductive electronics base plate and thermally coupled to the base plate. The base plate in turn is thermally coupled to a coolant passage.

Such electronic units are known in a variety of versions particularly in the field of power electronics and have the advantage that the power dissipated in the form of heat during operation of the electrical or electronic components can be transferred to a cooling medium (e.g. cooling liquid such as water) flowing through the coolant passage.

The attendant problem, however, is the greater or lesser risk of leakage from the coolant passage that is associated with such a cooling method. Depending on the type of coolant used and the circuit configuration cooled thereby, this problem can be particularly serious especially for an electronic unit of a compact configuration if the leaking coolant can reach the circuit configuration or its components. A typical example is water-cooling of power electronics in which relatively high electrical voltages are present during operation. In this case the penetration of cooling water into the electronics or the ingress of cooling water into an electronics housing could bring about short circuits, destroy components or even cause a fire. Leakage from the coolant passage is in practice particularly likely if the difference between coolant pressure and ambient pressure is particularly large. The risk of coolant penetration into the electronics is particularly great if both the coolant passage and the space occupied by the electrical or electronic components ("electronics compartment") are accommodated within a more or less enclosed housing structure.

A known possibility for minimizing the above risks is to use a cooler that is welded or soldered in as leak-proof a manner as possible, onto which electronics modules or the unpopulated flat sides of circuit substrates are attached (e.g. screwed on) via a thermally conductive paste or thermally conductive adhesive. The use of solder instead of thermally conductive paste or thermally conductive adhesive is mainly impractical, as the electronics modules i.e. circuit boards/substrates are often intended to be removable. When using solder there is also the risk of a crack formation in the solder if the components thermally coupled therewith have different thermal expansion coefficients. Aside from these disadvantages, using a cooler that is as reliably sealed as possible entails high production costs.

SUMMARY OF THE INVENTION

It is accordingly an object of the invention to provide an electronic unit with a sealed coolant passage which overcomes the above-mentioned disadvantages of the prior art devices of this general type, which has improved sealing of the coolant passage and reduces the resultant risks in the event of a leakage.

With the foregoing and other objects in view there is provided, in accordance with the invention, an electronic unit. The electronic unit contains a thermally conductive electronic base plate having an upper side and an underside. Components, being electric components and electronic components, are disposed on the upper side of the thermally conductive electronic base plate and thermally coupled to the base plate. A downward projecting ridge extends from the underside of the base plate and runs in an annularly closed manner. The ridge has an inner side and a lower end and is formed as a one-piece part with the base plate. A seal is provided. A cooler section has an upper side connected in a coolant-sealing manner to the ridge via the seal running in an annularly closed manner along the lower end of the ridge. The inner side of the ridge together with the underside of the base plate and the upper side of the cooler section delimit a coolant passage. The coolant passage is thermally coupled to the base plate.

The object is achieved according to the invention by a particular embodiment and configuration of the components delimiting the coolant passage. A particular advantage of the invention is that the underside of the base plate can come directly into contact with the coolant, i.e. "direct cooling" can be implemented.

According to a first aspect of the invention it is provided that the base plate has, on its underside, a downward projecting ridge formed as part of the base plate and running in an annularly closed manner. An inner side of the ridge together with the underside of the base plate and an upper side of a cooler section delimits the coolant passage. An upper side of the cooler section is connected in a coolant-sealing manner to the ridge via a seal running in an annularly closed manner on the lower end of the ridge.

By making the ridge running in an annularly closed manner as part of the base plate, this solution reliably prevents any coolant escaping from the coolant passage from coming into direct contact with the underside of the electronics base plate. This is of great importance particularly if the base plate has apertures such as screw holes, etc. and/or the coolant passage is disposed near an edge of the base plate so that coolant can pass from the underside of the base plate over a very short path (around the edge of the base plate) to the upper side of the base plate and hence into the electronics compartment.

According to a second aspect of the invention, the above object is achieved by a cooler section having a cutout and a ridge formed in one-piece with the cooler section and running in an annularly closed manner on the edge of the cutout, the inner side of which together with the underside of the base plate delimits the coolant passage. The underside of the base plate is connected in a coolant-sealing manner to the ridge via a sealing configuration running along the ridge. The sealing configuration incorporates two seals running in an annularly closed manner on the upper end of the ridge between which seals a space running in an annularly closed manner is delimited which is connected to a leakage path leading out of the cooler section.

In this solution the coolant passage is sealed by a sealing configuration on the underside of the electronics base plate. If leakage occurs in this area, a particular configuration of the sealing configuration ensures that any coolant escaping from the coolant passage is nevertheless reliably prevented from coming directly into contact with the underside of the base plate (and from there possibly entering the electronic compartment). That is to say the sealing compartment is "multi-stage" (with at least two seals running in an annularly closed manner), an "interspace" running in an annularly closed manner between the seals being connected to a pressure-relieving leakage path in the event of leakage. If a cooling medium present in the coolant passage should therefore overcome the first seal, it can be discharged via the leakage path in a controlled manner (e.g. away from the electronic base plate). Depending on the leakage rate and flow resistance, now only a more or less considerably reduced coolant pressure will be present at the second seal.

According to a third aspect of the invention, the above object is achieved in that the upper side of the base plate and associated components are sealed against the ingress of coolant by a housing structure and the underside of the base plate is connected in a coolant-sealing manner to a ridge running in an annularly closed manner via a seal running in an annularly closed manner. The ridge is embodied in an upwardly projecting manner on an upper side of a cooler section and its inner side together with the underside of the base plate and an upper side of the cooler section delimiting the coolant passage.

In this solution the coolant passage is sealed by a seal on the underside of the electronic base plate. If a leakage occurs in this area, by the likewise provided sealing of the upper side of the base plate and associated components, any coolant escaping from the coolant passage is nevertheless reliably prevented from directly entering the electronics compartment. It is worth mentioning in this connection that with this solution the coolant pressure of leaking coolant is not applied to the sealing on the upper side of the base plate. If when using this solution the cooler section is screwed to the base plate, screw holes must be provided which do not completely penetrate the base place, but are implemented as blind holes on the underside of the base plate.

For all the aspects of the invention explained above it shall be understood that the coolant passage can advantageously have at least one inlet and at least one outlet for letting coolant in and out respectively, i.e. for providing a flow path through the coolant passage. For all aspects such an inlet or outlet can extend through the base plate, through the ridge or through the cooler section.

In addition, for each of the aspects of the invention a plurality of coolant passages can also be provided that can either be completely separate from one another (e.g. with their own inlets and outlets) or "concatenated" in some way (e.g. in a parallel and/or serial configuration). For example, an outlet of a coolant passage can e.g. simultaneously constitute the inlet of a downstream coolant passage.

If the electronic unit has a plurality of coolant passages, some of these can be readily sealed according to one aspect of the invention and others according to another aspect of the invention. In other words, the aspects of the invention can also be combined with one another in one and the same electronic unit.

The electronic unit according to the invention is particularly suitable for use in an elevated ambient temperature such as occurs, for example, in the engine compartment of a motor vehicle.

In particular, an electronic unit implementing so-called power electronics can be cooled according to the invention in a reliable and relatively risk-free manner. Of particular interest here are electronic units in which an electrical voltage of more than 100 V occurs during operation at at least one location and the coolant used as such constitutes a risk of short circuit and/or is combustible. A preferred application exists for motor vehicle control units, such as engine control units, transmission control units, etc., particularly if these are installed close to the engine. For such devices there is in practice a great need for cooling of microelectronic components, particularly so-called power semiconductor components. Electrical voltages in excess of 100 V typically occur in control units for hybrid vehicles and in control units for controlling piezo-actuated fuel injection valves.

In a preferred embodiment it is provided that the base plate is implemented as part of the housing of an electronics module that contains some of the electrical or electronic components. Electronics modules per se are well known and are particularly advantageous in terms of demountability and exchangeability. However, the use of a module housing section as a base plate within the meaning of the present invention has the additional significant advantage that the relevant housing section, e.g. a flat side of an overall approximately cuboidal electronics module, is immediately adjacent to the coolant passage, i.e. comes into direct contact with the coolant during operation. If in this case the sealing is provided according to the first aspect of the invention, the relevant housing section must already have the ridge projecting therefrom and of a piece therewith. However, if the sealing is to be provided according to the second aspect of the invention, a conventional module (e.g. with a flat underside) can often be used particularly advantageously.

In a preferred embodiment it is provided that the base plate is implemented as a metal plate that is bonded flat to the underside of a circuit substrate for the electrical or electronic components.

For implementing the circuit substrate, technologies commonly used in the power electronics field can be employed. A multilayer structure is quite generally suitable containing one or more interconnect layers, at least some of which are patterned (and if necessary "plated through"), and one or more insulation layers (dielectric substrate) at least between adjacent interconnect layers. In one embodiment, a circuit substrate has a ceramic substrate material and one or more metal interconnect layers. Advantageously, for example, a comparatively minimal difference in the thermal expansion coefficients of the substrate (e.g. ceramic material) and the silicon material normally used in power electronics (of e.g. bare mounted silicon chips) can be realized. However, any other kinds of substrate can obviously be envisaged within the scope of the invention.

The abovementioned attachment of a metal plate to the underside of the circuit substrate can be performed as early as the board fabrication stage (e.g. in the case of a so-called DCB substrate), but also subsequently, e.g. using a thermally conductive paste, a thermally conductive adhesive or a solder joint. Particularly in respect of matching the thermal expansion coefficients of a circuit substrate and of a metal plate used as a base plate, it is provided in one embodiment that the base plate is made of a metal alloy, e.g. AlSiC, CuW or CuMo. If the base plate (or some of a plurality of base plates) is made of somewhat "exotic" and therefore expensive materials of this kind, sealing of the coolant passage according to the second aspect of the invention is mostly more advantageous, as the base plate can be made less complex in terms of its shape (without the ridge). In this connection it must also be considered that in the case of an embodiment according to the second aspect of the invention e.g. a cooler section containing a plurality of monolithically embodied ridges running in an annularly closed manner can also advantageously serve simultaneously as a cooler section for a plurality of relatively simply embodied and smaller-format base plates.

The coolant is preferably a cooling liquid. For use in the electronics of a motor vehicle, the coolant passage can be supplied with an internal combustion engine's circulating cooling water present anyway. It is alternatively or additionally possible for the electronics unit or the coolant passage provided therein to be connected to a coolant circulation system provided specifically for that purpose. A particularly interesting application for the invention is when the coolant passage is configured to take a coolant with a pressure of at least 2 bar, in particular at least 3 bar.

In an advantageous embodiment in respect of ease of mounting and the sealing effect for each seal it is provided that the ridge has a receiving groove for the seal or receiving grooves for the seals, and/or the component part, cooler section or base plate connected to the ridge via the seal or seal configuration has a receiving groove for the seal or receiving grooves for the seals.

In one embodiment it is provided that a plurality of separately implemented base plates are provided which are connected to a common cooler section via a corresponding number of seals or seal configurations. It can also be provided conversely to a certain extent that a plurality of separately implemented cooler sections are provided which are connected to a common base section via a corresponding number of seals or seal configurations.

In a development of the invention a coolant passage is implemented with a cooling-surface-enlarging structure. The structure can be made e.g. from the material of the base plate or cooling section or as a separately disposed structure (e.g. sheet metal). By suitably mounting or arranging such structures or cooling fins (such as so-called "turbolators") a selectively directed or turbulent and non-laminar flow can be advantageously created in the coolant passage(s) in order to improve the cooling effect.

As regards the material of the seal(s) used within the scope of the invention, materials of the kind commonly used in the field of fluid sealing (e.g. elastomers) can be advantageously used for this purpose.

In one embodiment of the invention it is provided that the seal or at least one of a plurality of seals is implemented as a seal ring. In terms of its length, such a seal ring can be implemented with a generally uniform cross-section, particularly e.g. a circular cross-section. Alternatively or additionally e.g. flat seals (e.g. of generally rectangular cross-section) can be used.

According to a preferred embodiment it is provided that the base section is removably connected to the cooler section, preferably e.g. screwed thereto. In respect of good sealing between the base plate and the cooler section, a screwed connection is preferably established by a plurality of threaded bolts or screws so that a uniform contact force can be achieved over the run of the seal(s) in a simple manner. For this purpose it is particularly advantageous if a plurality of screwing points is provided approximately following the annularly closed run of a seal, in a generally equidistant manner with respect to the run of the seal. For sealing the coolant passage according to the first aspect of the invention, such screwing points can be readily provided in the immediate vicinity of a seal, i.e. using screws or threaded bolts, which pass through local cutouts (through openings) of the seal. However, if the coolant passage is sealed according to the second aspect of the invention, it is advisable to ensure that, in the event of a leak, such screwing points do not constitute a short path for leaking coolant from the underside of the base plate to the upper side of the base plate (or other areas of the electronics compartment).

Other features which are considered as characteristic for the invention are set forth in the appended claims.

Although the invention is illustrated and described herein as embodied in an electronic unit with sealed coolant passage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
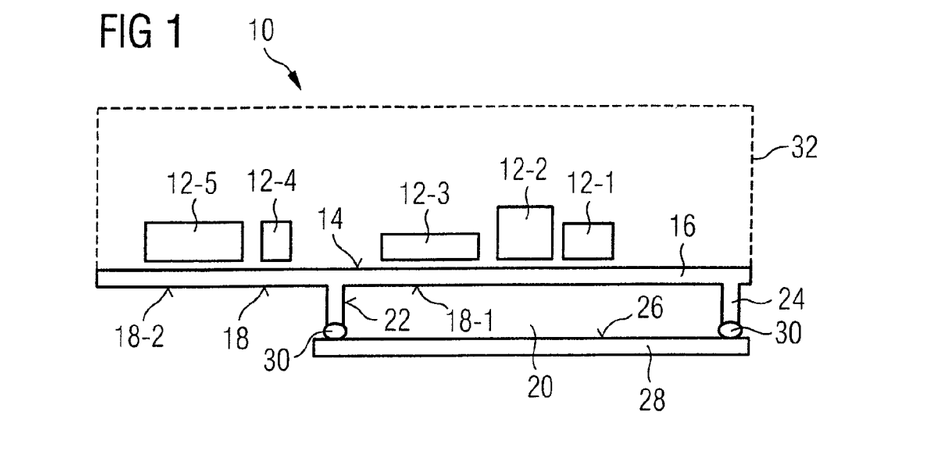
FIG. 1 is a diagrammatic, side view of an electronic unit according to a first embodiment of the invention.

Referring now to the figures of the drawing in detail and first, particularly, to FIG. 1 thereof, there is shown a first example of an electronic unit 10 (here: an engine control unit) in which electrical and electronic components 12-1 to 12-5 are disposed on an upper side 14 of a thermally conductive electronic base plate 16.

The base plate 16 is made of a particularly thermally conductive metallic material (e.g. aluminum or AlSiC), the upper side of which is bonded via a thermally conductive paste to the underside of a non-illustrated circuit substrate containing and interconnecting the components 12 in a per se known manner. Alternatively the base plate 16 could also be part (flat underside) of such a circuit substrate.

In the example shown, the underside 18 of the base plate 16 has a first area 18-1 and a second area 18-2. The first area 18-1 defines an upper limit of a coolant passage 20 that provides a flow path for cooling water during operation of the electronic unit. In the example shown, the space 20 is also delimited laterally by an inner side 22 of a ridge 24 running in an annularly closed manner and its lower limit is defined by an upper side 26 of a plate-shaped cooler 28.

Because the coolant passage 20 is immediately adjacent to the underside 18 of the base plate 16, the base plate 16 thermally coupled to the components 12 is therefore directly coupled thermally to the coolant passage 20, thereby providing an efficient cooling path from the components 12 to the cooling water during operation of the electronic unit 10.

The upper side 26 of the cooler section 28 is connected in a coolant sealing manner to the ridge 24 via a seal 30 running in an annularly closed manner on the free or lower end of the ridge 24. The ridge 24 is of one piece with the base plate 16 and projects downward from its underside 18.

FIG. 1 lastly shows a further housing structure 32 illustrated by a dashed line, containing one or more housing sections that provide a protective top cover for the electronics. As may be seen from FIG. 1, the base plate 16 and/or the cooler section 28 can likewise be part of a housing structure enclosing the entire system.

In the following description of further exemplary embodiments, the same reference characters will be used for components having an identical effect, supplemented in each case by a lower case letter to differentiate the embodiment. The description will generally detail only the differences with respect to the example(s) already described and reference will otherwise be made exclusively to the description of previous examples. The reference numerals of components which are multiply provided but analogous in their effect in an embodiment are consecutively numbered (supplemented in each case by a dash and a serial number). Reference will also be made below to individual components of this kind or to the totality of such components by the unsupplemented reference numeral.

Figure 2:
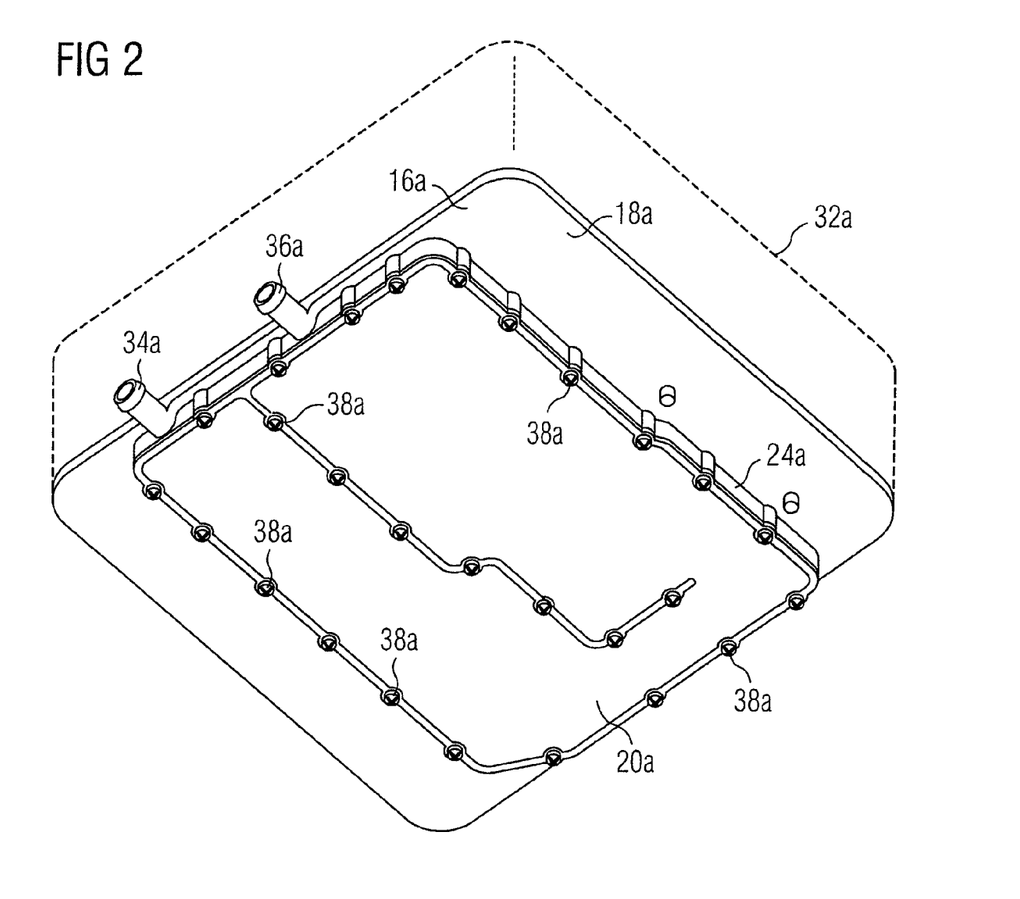
FIG. 2 is a perspective view of an electronic base plate for an electronic unit according to a second embodiment of the invention.

FIG. 2 shows a base plate 16a for an electronic unit according to a second exemplary embodiment. Clearly recognizable in FIG. 2 is the annularly closed run of a ridge 24a that projects downward from the underside 18a of the base plate 16a.

In contrast to the above-described example, FIG. 2 additionally shows a cooling water inlet 34a and a cooling water outlet 36a that in the example illustrated are embodied as tubular fittings (for connecting tubes) and provide an inlet passage or outlet passage through the ridge 24a.

Likewise in contrast to the above-described example, within its annularly closed run the ridge 24a has further ridge sections that in the example shown extend in an elongated pattern with a plurality of bends. In the example shown, the additional ridge section is of one piece with the inner side 22a of the ridge 24a. It provides not only mechanical stabilization of the base plate 16a and of a non-illustrated cooler section but also causes the flow of cooling water from the cooling water inlet 34a to the cooling water outlet 36a to be advantageously channeled.

Also in contrast to the above-described example, FIG. 2 shows how the cooler section is connected to the base plate 16a illustrated. At screwing points 38a the ridge 24a has a larger cross-section and embodies blind holes for screwing the cooler section 28 to the base plate 16a, screws passing through correspondingly disposed cutouts in the interposed seal.

For the two embodiments as shown in FIGS. 1 and 2 it is important in each case that in the event of leakage from the coolant passage 20 or 20a in the area of the seal ring the cooling water cannot escape in the immediate vicinity of the underside 18 or 18a of the base plate 16 or 16a but at a distance therefrom. This prevents escaping cooling water from having a relatively short path into the electronics compartment.

Figure 3:
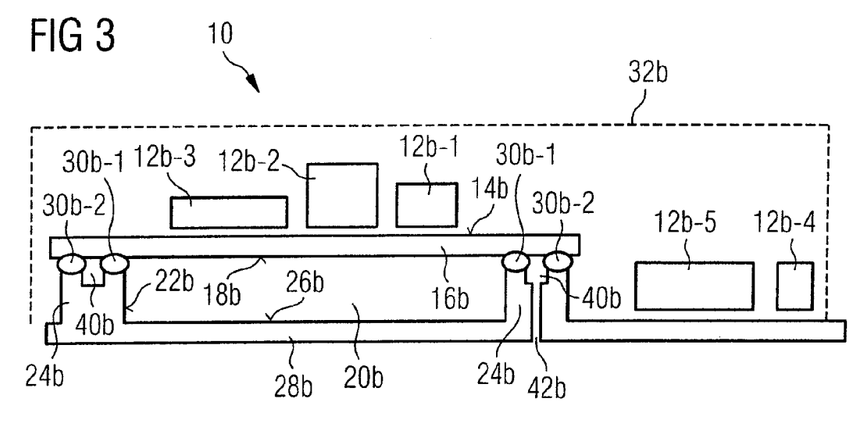
FIG. 3 is a diagrammatic, side view of an electronic unit according to a third embodiment of the invention.

FIG. 3 shows a third example of an electronic unit 10b that is formed using an electronic base plate 16b and a cooler section 28b disposed thereunder.

The underside 18b of the base plate 16b is again immediately adjacent to a coolant passage 20b whose lower limit is defined by an upward facing surface 26b of the cooler section 28b. As in the above-described examples, the coolant passage 20b is again laterally delimited by an inner side 22b of a ridge 24b running in an annularly closed manner around the coolant passage 20b.

In contrast to the above-described examples, however, the ridge is not of a part of the base plate, but is a part of the cooler section 28b. In the example shown, the ridge 24b projects upward from the upper side 26b.

The underside 18b of the base plate 16b is connected to the ridge 24b in a coolant sealing manner via a sealing configuration running along the free (upper) end of the ridge 24b, the sealing configuration formed of two seals 30b-1 and 30b-2 running in an annularly closed manner on the upper end of the ridge 24b, between which an annularly closed space 40b is delimited which is connected to at least one leakage passage 42b extending downward through the ridge 24b and out of the cooler section 28b.

For this embodiment it is important that in the event of leakage from the coolant passage 20b in the area of the first seal ring 30b-1, cooling water penetrating into the interspace 40b is discharged in a controlled manner through the leakage passage 42b in order to reduce the risk of ingress into the electronics compartment. The provision of the leakage passage 42b reliably prevents appreciable water pressure from being applied to the inner side of the second seal ring 30b-2 in the event of a leak. In the example shown, the leakage passage 42b leads downward and out of the cooler section 26b.

To prevent an excessive over-pressure or under-pressure in the interspace 40b, there is preferably provided at the lower orifice of the leakage passage 42b in FIG. 3 a non-illustrated pressure-equalizing element which in practice also prevents e.g. any ingress of water (such as rain water) from outside into the interspace 40b.

By use of a "double seal" between the cooling water circuit and the electronic compartment and the possibility of leakage between the two circumferential individual seals to the environment, the risk of leakage and the extent of its consequences is significantly reduced. Through the addition of a circumferential "secondary" seal 30b-2 outside the first "primary" seal ring 30b-1 and the introduction of a leakage point between the two seals 30b-1 and 30b-2, the possibly relatively high cooling water pressure (e.g. approximately 3 bar, or even more) cannot be present at the secondary seal to the housing. Therefore, the inner electronics compartment is much less at risk, because the electronic compartment is doubly protected and the cooling water pressure provided for the coolant passage 20b cannot be present at the secondary housing seal 30b-2.

In the embodiment shown in FIG. 3, some of the components 12b, namely the components 12b-4 and 12b-5, are not disposed on the upper side 14b of the base plate 16b but adjacently thereto, on the upper side 26b of the cooler section 28b. The electronic compartment is therefore delimited partly by the upper side 14b of the base plate 16b and partly by the upper side 26b of the cooler section 28b. However, as FIG. 3 illustrates, this does not pose a problem because of the "double seal" 30b-1, 30b-2.

Alternatively to the example shown, a plurality of base plates could also be disposed adjacent to one another on the upper side of the cooler section 28b.

Figure 4:
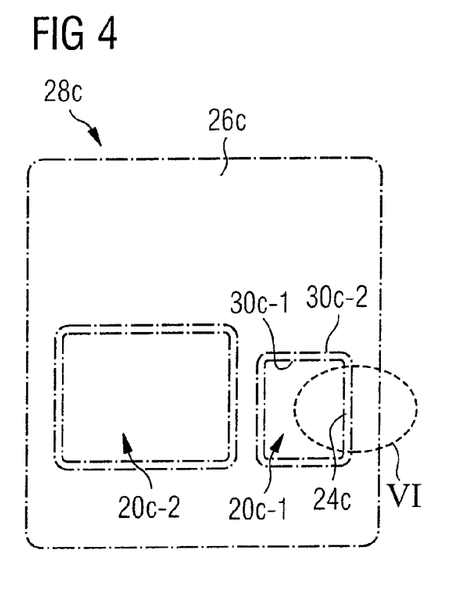
FIG. 4 is a diagrammatic, top plan view of a plate-shaped cooler section for an electronic unit according to fourth embodiment of the invention.
Figure 5:
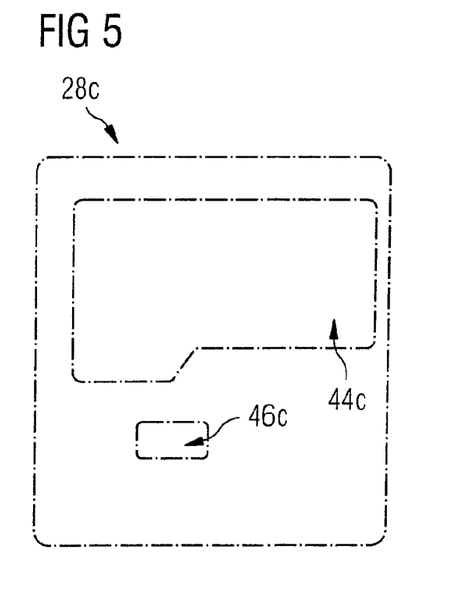
FIG. 5 is a diagrammatic, bottom plan of the cooler section of FIG. 4, viewed from the opposite side.
Figure 6:
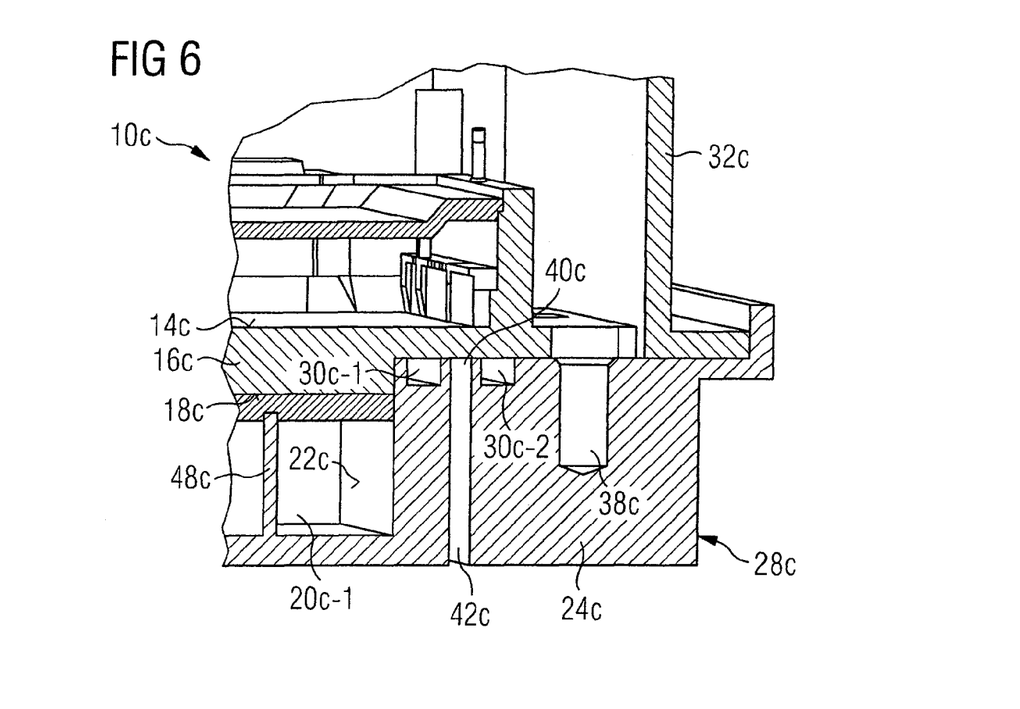
FIG. 6 is a partial section view of the electronic unit formed using the base section according to FIGS. 4 and 5.

FIGS. 4, 5 and 6 illustrate a fourth example of an electronic unit 10c using an electronic base plate 16c and a cooler section 28c, connected via an interposed, two-stage sealing configuration 30c-1, 30c-2.

FIG. 4 schematically illustrates the approximately square outline of the approximately plate shaped cooler section 28c, viewed from above. Extending as a part of the cooler section

28c there is again provided a ridge section 24c running in an annularly closed manner which laterally delimits a coolant passage 20c-1.

In this example there is additionally provided a second coolant passage 20c-2 which will not be described in greater detail below for the sake of explanational simplicity. Its description can be dispensed with, particularly as the sealing of the second coolant passage 20c-2 is implemented in the same way as that of the first coolant passage 20c-1 described below.

At the upper end of the ridge 24c there are again disposed a primary seal ring 30c-1 and a secondary seal ring 30c-2 which are represented by dashed lines in FIG. 4 and implement the sealing of the cooler section 28c to the electronic base plate 16c in the finished electronics unit (see FIG. 6).

FIG. 5 is a view of the cooler section 28c from underneath and illustrates further features of this example. For example, a first larger cutout 44c and a second smaller cutout 46c can be seen on the underside of the cooler section 28c shown. The approximately plate shaped cooler section 28c is embodied relatively thick in this example. The two cutouts 44c and 46c possess considerable depth, but do not completely penetrate cooler section 28c.

With the cutout 44c, a further third coolant passage is implemented which will not be described in greater detail below. On the other hand, the cutout 46c serves to create a connecting passage between the coolant passages 20c-1 and 20c-2 whose position is shown in FIG. 4. For this purpose the cutout 46c extends into the material of the cooler section 28c to a depth reaching the area of the annularly running ridges (e.g. 24c). On the finished electronic unit 10c the cutouts 44c, 46c shown in FIG. 5 are covered in any suitable way in a coolant-sealing manner.

FIG. 6 shows a partial sectional perspective view of the area of the finished electronic unit 10c marked with VI in FIG. 4, the sealing of the coolant passage 20c-1 to the electronics compartment located above (and laterally to) the base plate 16c being clearly discernible. For this purpose the cooler section 28c has the ridge 24c which laterally delimits the coolant passage 20c-1, the "double seal" 30c-1, 30c-2 to the underside 18c of the base plate 16c being implemented on the upper end of the ridge 24c.

FIG. 6 additionally shows one screw 38c of a plurality of screws by which the base plate 16c is screwed to the cooler section 28c.

If during operation of the electronics unit 10c the first seal ring 30c-1 fails, ingress of the leaking coolant into the electronics compartment is reliably prevented by the coolant being discharged via a leakage passage 42c, which at the same time advantageously provides pressure relief of an interspace 40c between the two seal rings 30c-1 and 30c-2.

Figure 7:
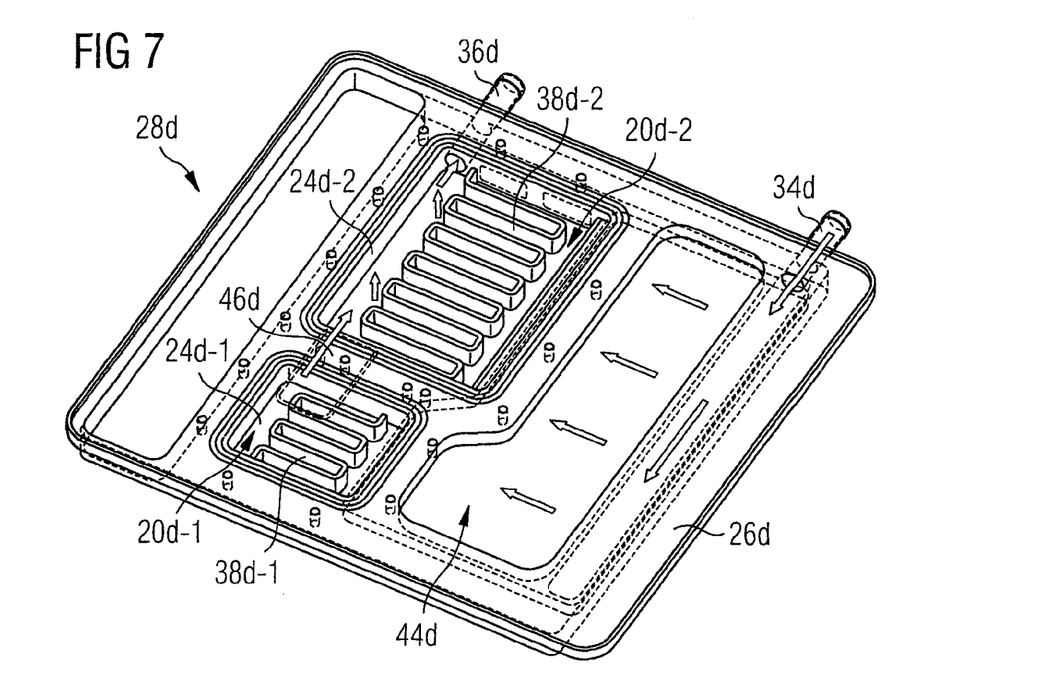
FIG. 7 is a perspective view of the cooler section for the electronic unit according to a fifth embodiment of the invention.

FIG. 7 shows a perspective view from below of a cooler section 28d according to a fifth exemplary embodiment.

A feature of this embodiment is that the cooler section 28d is made without undercuts and therefore particularly inexpensively. The cooler section 28d is completely penetrated by a large cutout 44d and by cutouts in the area of the subsequent coolant passages 20d-1 and 20d-2.

On the opposite side, the coolant passages 20d-1 and 20d-2 are again interconnected by a smaller cutout 46d and are otherwise laterally delimited by an annularly closed circumferential ridge 24d-1 and 24d-2 respectively. These ridges or orifice edge sections are of a piece with the material of the cooler section 28d and project upward from the body of the cooler section 28d (downward in FIG. 7). On the free ends of the ridges 24d-1, 24d-2 running in an annularly closed manner the sealing of the coolant passages 20d-1 and 20d-2 is again provided by a "double seal" of the type already described above. On the underside of the cooler section 28d which is discernible in FIG. 7 the coolant passages 20d-1 and 20d-2 are subsequently sealed in a suitable manner (e.g. by one or more soldered-on cover plates). The same applies to the through-cutout 44d.

In the finished electronic unit a flow path through the areas 44d, 20d-1 and 20d-2 is provided, partly parallel and partly sequential, as shown by arrows in FIG. 7. One of the covers of the cutout 44d supports and cools electrolytic capacitors of the circuit configuration, whereas the coolant passages 20d-1, 20d-2 are used to cool the power electronics sections formed by active microelectronic components.

FIG. 7 also shows "turbolator" structures 38d-1 and 38d-2 for improving the cooling effect or channeling the flow of coolant.

Figure 8:
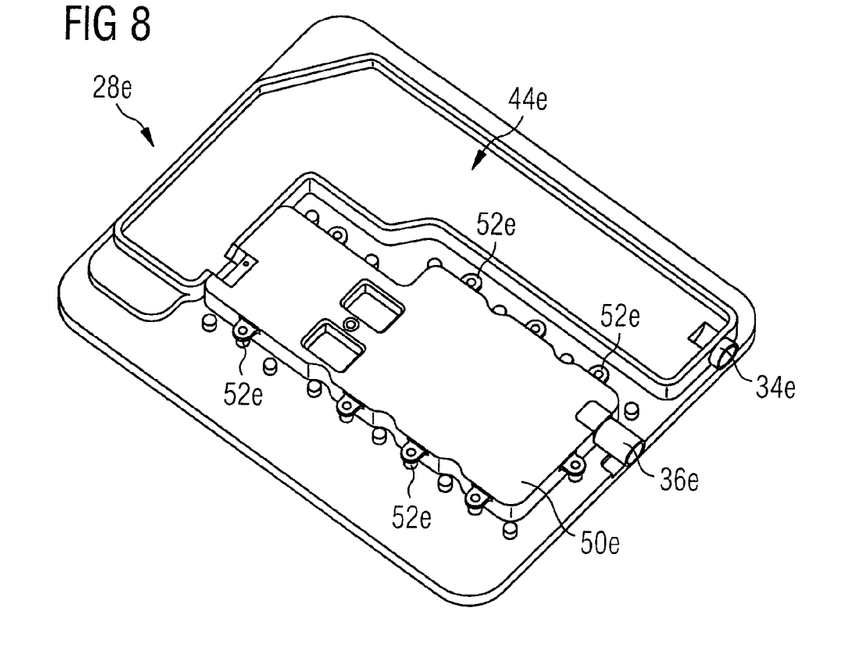
FIG. 8 is a perspective view of a cooler section for the electronic unit according to a sixth embodiment of the invention.
Figure 9:
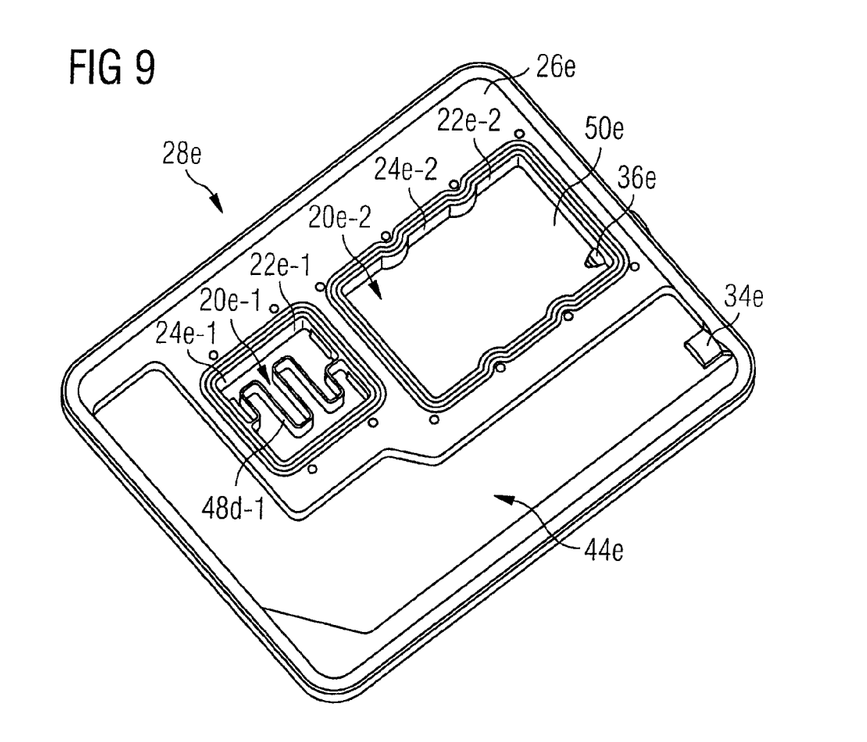
FIG. 9 is a perspective view of the cooler section of FIG. 8, viewed from the opposite side.

FIGS. 8 and 9 finally show a sixth embodiment of a cooler section 28e in which, similarly to the above-described version, two consecutively flowed-through coolant passages 20e-1 and 20e-2 are provided.

As in the above described embodiment, these coolant passages 20e are formed as through-openings in the material of the cooler section 28e. These are downwardly sealed in a coolant-sealing manner by a cover section 50e that is separate but common to the two coolant passages.

As shown in FIG. 8 the cover section 50e is screwed at screwing points 52e to the body of the cooler section 28e (with the interposition of a ring seal).

The sealing by a single seal at this point is uncritical in that the electronics compartment is located on the side of the cooler section 28e opposite the cover section 50e and the electronics compartment is reliably protected from any escaping coolant by the "double seal" concept already described above.

Figure 10:
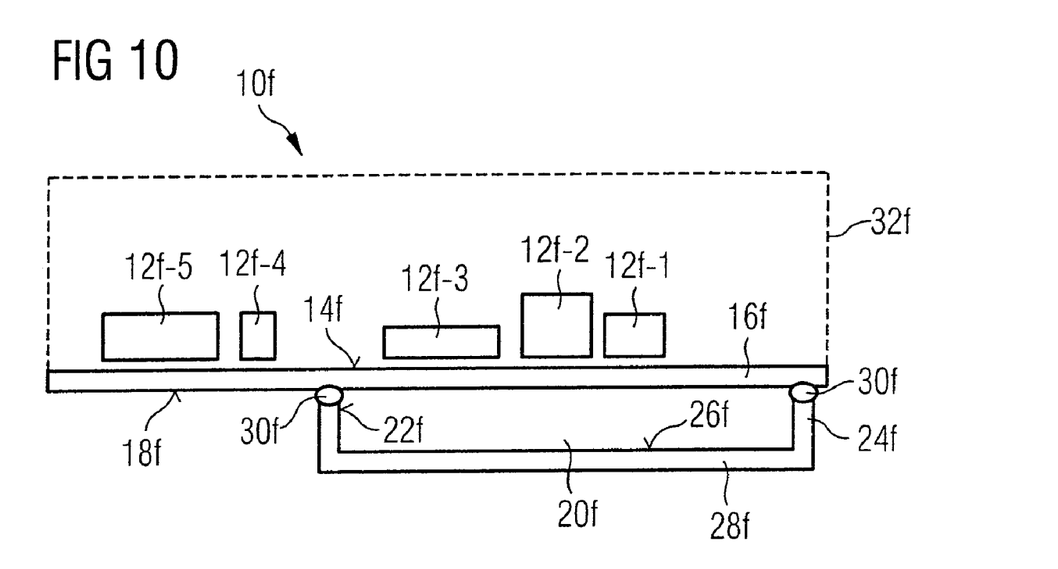
FIG. 10 is a diagrammatic, side view of the electronic unit according to a seventh embodiment of the invention.

FIG. 10 shows a seventh example of an electronic unit 10f formed using an electronic base plate 16f and a cooler section 28f disposed thereunder.

An upper side 26f of the cooler section 28f is directly adjacent to a coolant passage 20f that is upwardly delimited by a downward facing surface 18f of the base plate 16f. The coolant passage 20f is again laterally delimited by the inner side 22f of a ridge 24f running in an annularly closed manner around the coolant passage 20f.

In the example shown, the ridge 24f is of a piece with the cooler section 28f from which it projects upward.

The underside 18f of the base plate 16f is connected to the ridge 24f in a coolant sealing manner via a seal 30f running along the free or upper end of the ridge 24f, the seal 30f formed e.g. of an elastomeric seal ring which is interposed during assembly of the electronics unit 10f.

An important aspect of this embodiment is that in the event of leakage from the coolant passage 20f in the area of the seal ring 30f, escaping coolant cannot pass directly into the electronics compartment, as the upper side 14f of the base plate 16f is connected in a coolant-sealing manner to the upper housing structure 32f.

The cooler section 28f is preferably mounted to the base plate 16f and/or the housing structure 32f by a screwed connection whereby, as in the embodiments explained above, the seal used can be appropriately clamped in position. For example, screws passing through the cooler section from below can be screwed into blind holes on the underside of the base plate. In the area of such blind holes the base plate thickness can be increased accordingly. Alternatively it is also conceivable for the base plate thickness to be selected greater overall.

In this embodiment, coolant inlets or outlets (e.g. tubular ducts) can be advantageously placed very freely on the cooler section depending on the circumstances. No special shaping of the electronic base plate is required for this purpose. Accordingly it is mostly advantageous in this embodiment, as in the above-described embodiments also, to provide cooling inlets or outlets on the cooler section (e.g. by appropriate shaping). Moreover, it is advantageous for the above-described embodiments if the upper side of the electronic base plate is largely flat.

The common feature of all the embodiments described above is that the coolant passage is sealed in such a way that if a seal (implemented e.g. by an elastomeric seal ring or a soldered joint) is overcome, the escaping coolant cannot penetrate directly into the electronics compartment. "Direct cooling" also takes place in the sense that the underside of the electronic base plate comes into direct contact with the coolant during operation of the electronics unit.

The invention claimed is:

1. An electronic unit, comprising:
   a thermally conductive electronic base plate having an upper side and an underside;
   components, selected from the group consisting of electric components and electronic components, thermally coupled to said base plate;
   a cooler section having a cutout formed therein, a ridge with an upper end running in an annularly closed manner along an edge of said cutout, and a leakage passage, said ridge having an inner side which together with said underside of said base plate delimiting a coolant passage; and
   a sealing configuration, said underside of said base plate being connected in a coolant-sealing manner to said ridge via said sealing configuration running along said ridge, said sealing configuration having two seals running in an annularly closed manner along said upper end of said ridge and between said two seals a space running in an annularly closed manner is delimited and connected to said leakage passage leading out of said cooler section.

2. The electronic unit according to claim 1, further comprising a housing structure, said upper side of said base plate and said components are sealed against an ingress of coolant by said housing structure and said underside of said base plate is connected in said coolant-sealing manner to said ridge running in said annularly closed manner via said sealing configuration running in said annularly closed manner, said ridge being embodied in an upwardly projecting manner on an upper side of said cooler section and said inner side together with said underside of said base plate and said upper side of said cooler section delimiting said coolant passage.

3. The electronic unit according to claim 1, wherein said base plate is implemented as part of a housing of an electronics module containing at least some of said components.

4. The electronic unit according to claim 1, further comprising a circuit substrate for supporting said components and having an underside, said base plate is a metal plate attached flat to said underside of said circuit substrate.

5. The electronic unit according to claim 1, wherein said coolant passage is configured to take a coolant having a pressure of at least 2 bar.

6. The electronic unit according to claim 1, wherein said ridge has receiving grooves formed therein for receiving said seals.

7. The electronic unit according to claim 1, wherein one of said cooler section and said base plate, connected to said ridge via said sealing configuration, has receiving grooves formed therein for receiving said seals.

8. The electronic unit according to claim 1, wherein:
   said sealing configuration is one of a plurality of sealing configurations; and
   said base plate is formed of a plurality of separately embodied base plate parts connected to said cooler section via a corresponding one of said sealing configurations.

9. The electronic unit according to claim 1, wherein the electronic unit is a control unit for a motor vehicle.

10. The electronic unit according to claim 1, wherein said coolant passage is configured to take a coolant having a pressure of at least 3 bar.

* * * * *